United States Patent

Van Santen et al.

(10) Patent No.: US 7,618,250 B2
(45) Date of Patent: Nov. 17, 2009

(54) IMPRINT LITHOGRAPHY

(75) Inventors: Helmar Van Santen, Amsterdam (NL);
Aleksey Yurievich Kolesnychenko, Helmond (NL); Yvonne Wendela Kruijt-Stegeman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 457 days.

(21) Appl. No.: 11/440,439

(22) Filed: May 25, 2006

(65) Prior Publication Data

US 2006/0275524 A1 Dec. 7, 2006

Related U.S. Application Data

(63) Continuation-in-part of application No. 11/138,898, filed on May 27, 2005, now abandoned.

(51) Int. Cl.
   *B29C 59/00* (2006.01)
(52) U.S. Cl. ....................... 425/171; 425/385
(58) Field of Classification Search ............. 425/174.4, 425/385, 171, 174.1; 355/48, 72, 91, 887; 396/428; 430/22, 322, 30, 324; 264/401; 427/458; 700/240
   See application file for complete search history.

(56) References Cited

U.S. PATENT DOCUMENTS

| | | | |
|---|---|---|---|
| 5,414,514 A | 5/1995 | Smith et al. | |
| 5,512,131 A | 4/1996 | Kumar et al. | 156/655.1 |
| 5,772,905 A | 6/1998 | Chou | 216/44 |
| 6,088,103 A | 7/2000 | Everett et al. | |
| 6,165,911 A | 12/2000 | Calveley | 438/754 |
| 6,309,580 B1 | 10/2001 | Chou | 264/338 |
| 6,334,960 B1 | 1/2002 | Willson et al. | 216/52 |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,518,189 B1 | 2/2003 | Chou | 438/706 |
| 6,656,341 B2 | 12/2003 | Petersson et al. | 205/667 |
| 6,696,220 B2 | 2/2004 | Bailey et al. | 430/272.1 |
| 6,719,915 B2 | 4/2004 | Willson et al. | 216/44 |
| 6,921,615 B2 | 7/2005 | Sreenivasan et al. | 430/22 |
| 7,070,405 B2 | 7/2006 | Sreenivasan et al. | |

(Continued)

FOREIGN PATENT DOCUMENTS

EP   1 617 293 A3   1/2006

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

(Continued)

*Primary Examiner*—Yogendra Gupta
*Assistant Examiner*—Thu Khanh T Nguyen
(74) *Attorney, Agent, or Firm*—Pillsbury Winthrop Shaw Pittman LLP

(57) ABSTRACT

An imprint lithography apparatus is disclosed that has a template holder configured to hold an imprint template, a substrate table, and an optical encoder, the optical encoder having a radiation output, a first diffraction grating, and a detector, the radiation output arranged to illuminate a second diffraction grating and the detector positioned to detect radiation diffracted by the first and second diffraction gratings to provide an alignment signal.

16 Claims, 7 Drawing Sheets

U.S. PATENT DOCUMENTS

| | | |
|---|---|---|
| 7,251,018 B2 | 7/2007 | Van Buel |
| 2002/0093122 A1 | 7/2002 | Choi et al. ............... 264/401 |
| 2002/0094496 A1 | 7/2002 | Choi et al. ............... 430/322 |
| 2002/0132482 A1 | 9/2002 | Chou ..................... 438/692 |
| 2002/0167117 A1 | 11/2002 | Chou ..................... 264/338 |
| 2002/0170880 A1 | 11/2002 | Chen |
| 2002/0177319 A1 | 11/2002 | Chou ..................... 438/690 |
| 2003/0034329 A1 | 2/2003 | Chou ..................... 216/44 |
| 2003/0080471 A1 | 5/2003 | Chou ..................... 264/338 |
| 2003/0080472 A1 | 5/2003 | Chou ..................... 264/338 |
| 2003/0081193 A1 | 5/2003 | White et al. ............ 355/72 |
| 2003/0127580 A1 | 7/2003 | Ling et al. .............. 249/115 |
| 2003/0139042 A1 | 7/2003 | Heidari .................. 438/689 |
| 2003/0141291 A1 | 7/2003 | Heidari et al. .......... 219/460.1 |
| 2003/0159608 A1 | 8/2003 | Heidari .................. 101/494 |
| 2003/0170053 A1 | 9/2003 | Montelius et al. ....... 399/318 |
| 2003/0189273 A1 | 10/2003 | Olsson ................... 264/293 |
| 2004/0005444 A1 | 1/2004 | Heidari .................. 428/212 |
| 2004/0009673 A1 | 1/2004 | Sreenivasan et al. .... 438/694 |
| 2004/0021866 A1 | 2/2004 | Watts et al. ............ 356/401 |
| 2004/0022888 A1 | 2/2004 | Sreenivasan et al. .... 425/174.4 |
| 2004/0036201 A1 | 2/2004 | Chou et al. ............. 264/402 |
| 2004/0046288 A1 | 3/2004 | Chou ..................... 264/479 |
| 2004/0081798 A1 | 4/2004 | Lee et al. ............... 428/141 |
| 2004/0124566 A1 | 7/2004 | Sreenivasan et al. .... 264/494 |
| 2004/0149367 A1 | 8/2004 | Olsson et al. ........... 156/64 |
| 2004/0169003 A1 | 9/2004 | Lee et al. ............... 216/4 |
| 2004/0192041 A1 | 9/2004 | Jeong et al. ............. 438/689 |
| 2004/0200411 A1 | 10/2004 | Willson et al. ........... 118/500 |
| 2004/0209470 A1 | 10/2004 | Bajorek .................. 438/689 |
| 2004/0219249 A1 | 11/2004 | Chung et al. ............ 425/385 |
| 2004/0219461 A1 | 11/2004 | Chung et al. ............ 430/311 |
| 2005/0039618 A1 | 2/2005 | Heidari et al. ........... 101/368 |
| 2005/0064054 A1 | 3/2005 | Kasumi ................... 425/112 |
| 2005/0064344 A1 | 3/2005 | Bailey et al. |
| 2005/0067379 A1 | 3/2005 | Sreenivasan et al. |
| 2006/0007440 A1 | 1/2006 | Kuroda et al. |

FOREIGN PATENT DOCUMENTS

| | | |
|---|---|---|
| JP | 2005-108975 A | 4/2005 |
| JP | 2006-516065 T | 6/2006 |
| WO | WO 01/79591 A1 | 10/2001 |
| WO | WO 01/79592 A1 | 10/2001 |

OTHER PUBLICATIONS

MIT Technology Insider, "Following the Bouncing Microparticle: Tiny, Porous Balls from Acusphere Can Carry Gas—to Make Ultra Sound Glow Brighter—Or Drugs—To Fight Cancer More Safely", MIT Technology Review, Feb. 2005.

Office Action mailed Aug. 23, 2007 for U.S. Appl. No. 11/138,898.

Notice of Reasons for Rejection for Japanese Patent Application No. 2006-146620 dated Apr. 30, 2009.

"PRIOR ART"

"PRIOR ART"

"PRIOR ART"

"PRIOR ART"

IMPRINT LITHOGRAPHY

RELATED APPLICATIONS

This application is a continuation-in-part of U.S. patent application Ser. No. 11/138,898 filed May 27, 2005, now abandoned, the entire contents of which is hereby incorporated by reference.

FIELD

The invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes.

As mentioned above, imprint lithography may be used to manufacture multiple layer structures, such as integrated circuits. In order to manufacture such multiple layer structures, each layer is typically independently imprinted. For example, a first layer is imprinted into a substrate, following which the imprinted material is treated such that the pattern imprinted therein becomes fixed. A second layer is then imprinted onto the first layer and treated, followed by third and fourth layers, etc. In some IC designs up to thirty layers may be used.

Manufacture of multiple layer structures is commonplace using optical lithography apparatus. However, it has so far proved difficult to manufacture such structures using imprint lithography, due to difficulties in aligning the patterns of successive layers such that they correspond correctly. Alignment between successive layers should be achieved with high accuracy otherwise device components, which are constructed by several layers, will not contact one another or do so improperly with the result that the device components may not function as intended.

SUMMARY

According to a first aspect of the invention, there is provided an imprint lithography apparatus comprising a template holder configured to hold an imprint template, a substrate table, and an optical encoder, the optical encoder having a radiation output, a first diffraction grating, and a detector, the radiation output arranged to illuminate a second diffraction grating and the detector positioned to detect radiation diffracted by the first and second diffraction gratings to provide an alignment signal.

According to a second aspect of the invention, there is provided a method of alignment for an imprint lithography apparatus comprising an imprint template and an optical encoder having a radiation output, a first diffraction grating, and a detector, the method comprising directing radiation from the radiation output onto a second diffraction grating, and detecting radiation diffracted by the first and second diffraction gratings to provide an alignment signal.

According to a third aspect of the invention, there is provided an imprint template for use in an imprint lithography apparatus comprising an alignment detector, the imprint template comprising an alignment mark and an optical element configured to direct radiation traversing the alignment mark to the detector of the imprint lithography apparatus.

One or more embodiment of the invention are applicable to any imprint lithography process in which a patterned template is imprinted into an imprintable medium in a flowable state, and for instance can be applied to hot and UV imprint lithography as described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
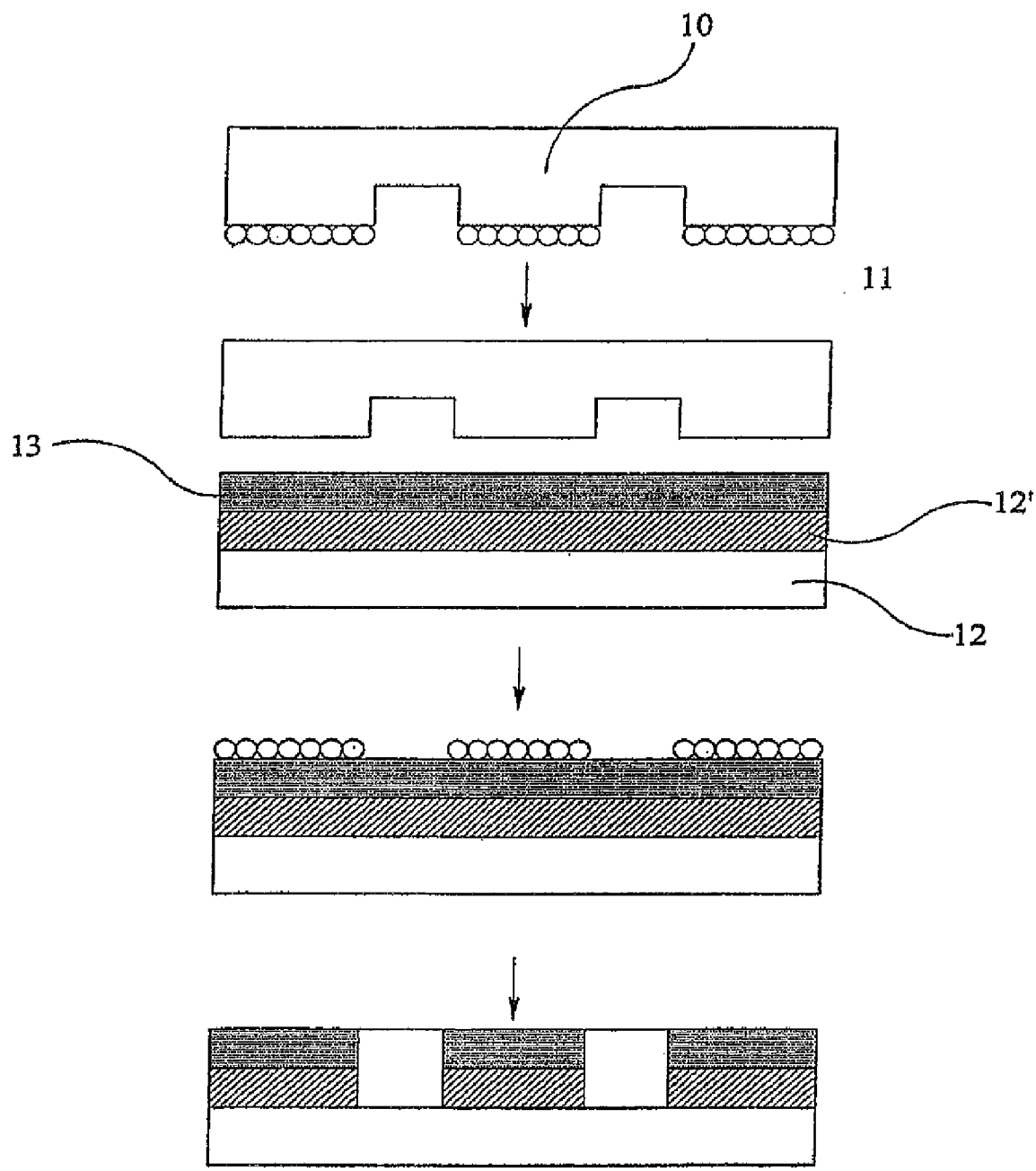
FIG. 1a-1c illustrate examples of conventional soft, hot and UV lithography process respectively.
Figure 1B:
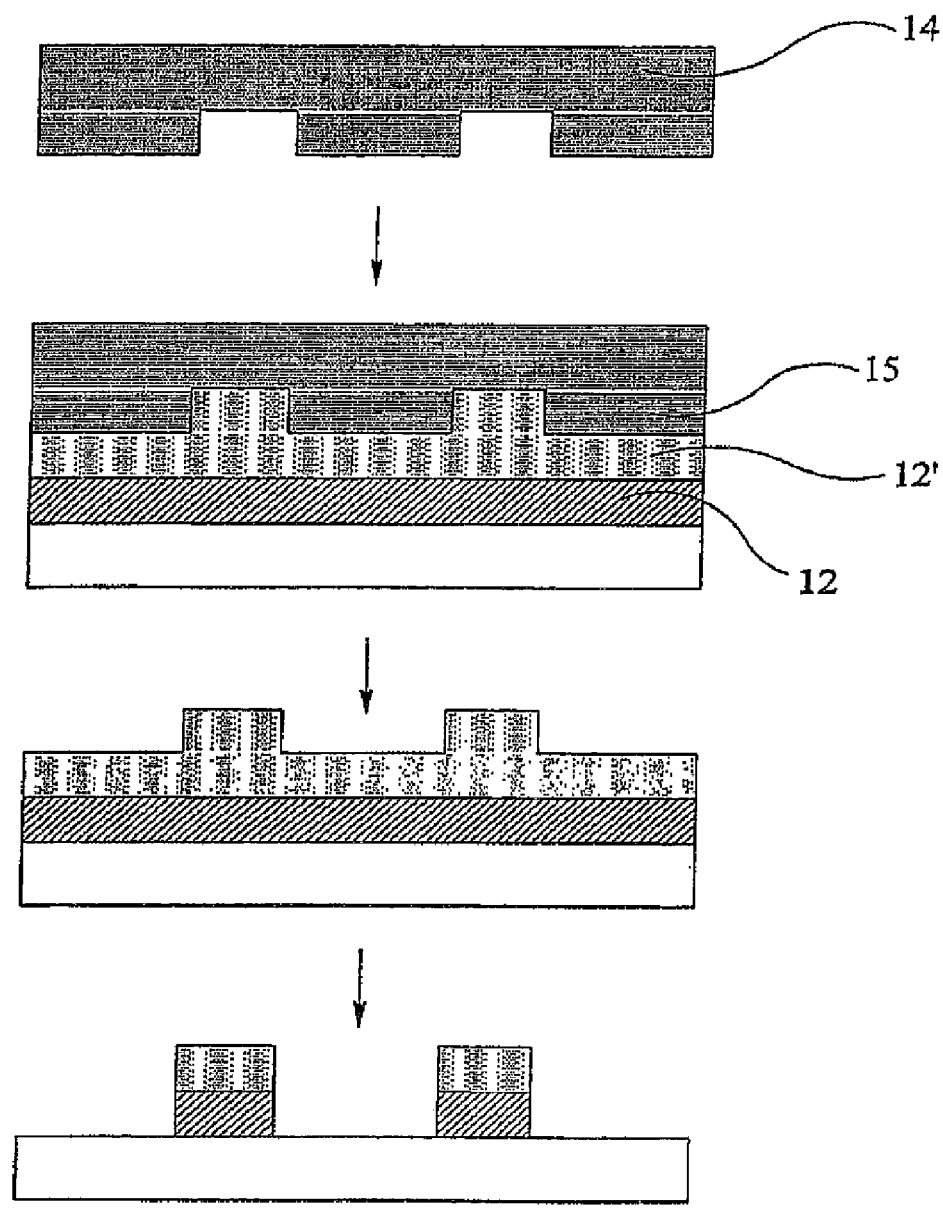
Figure 1C:
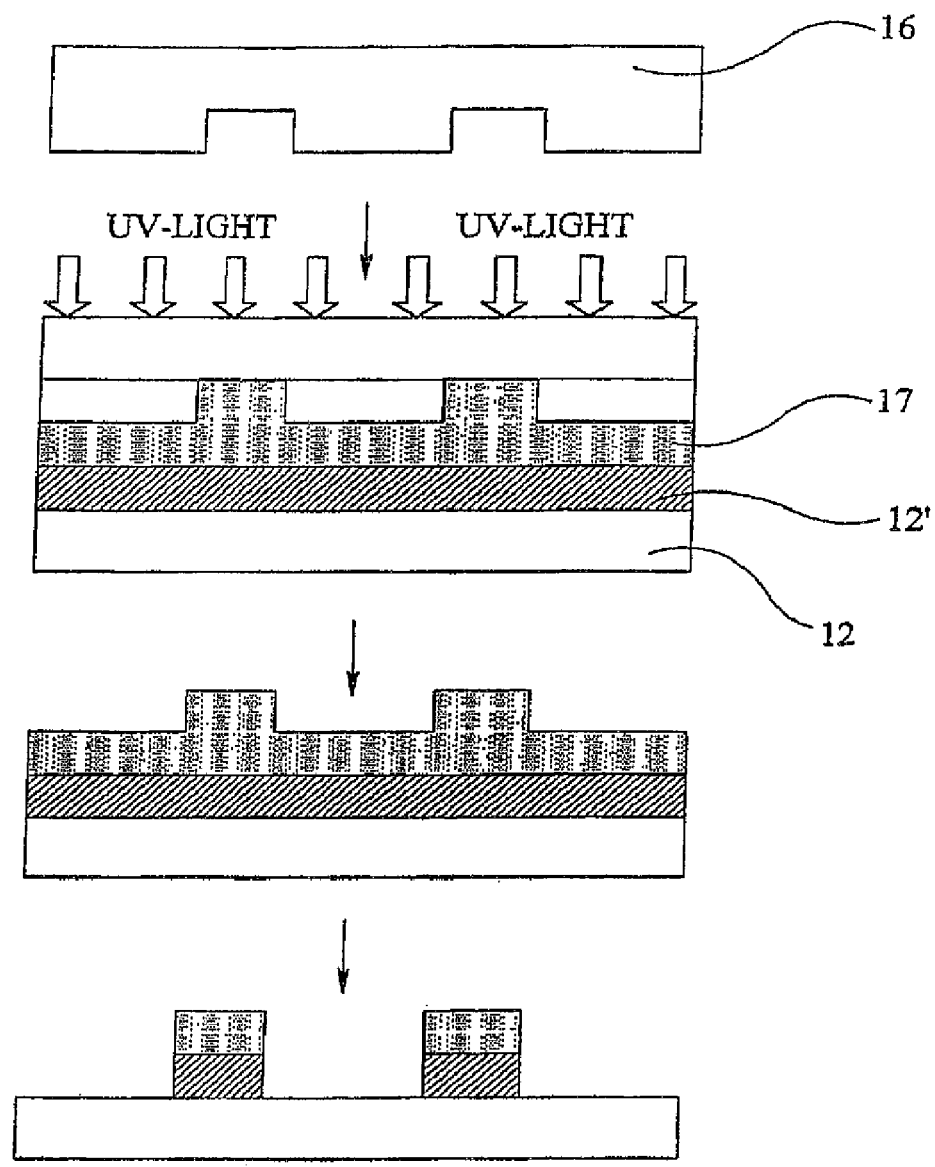

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
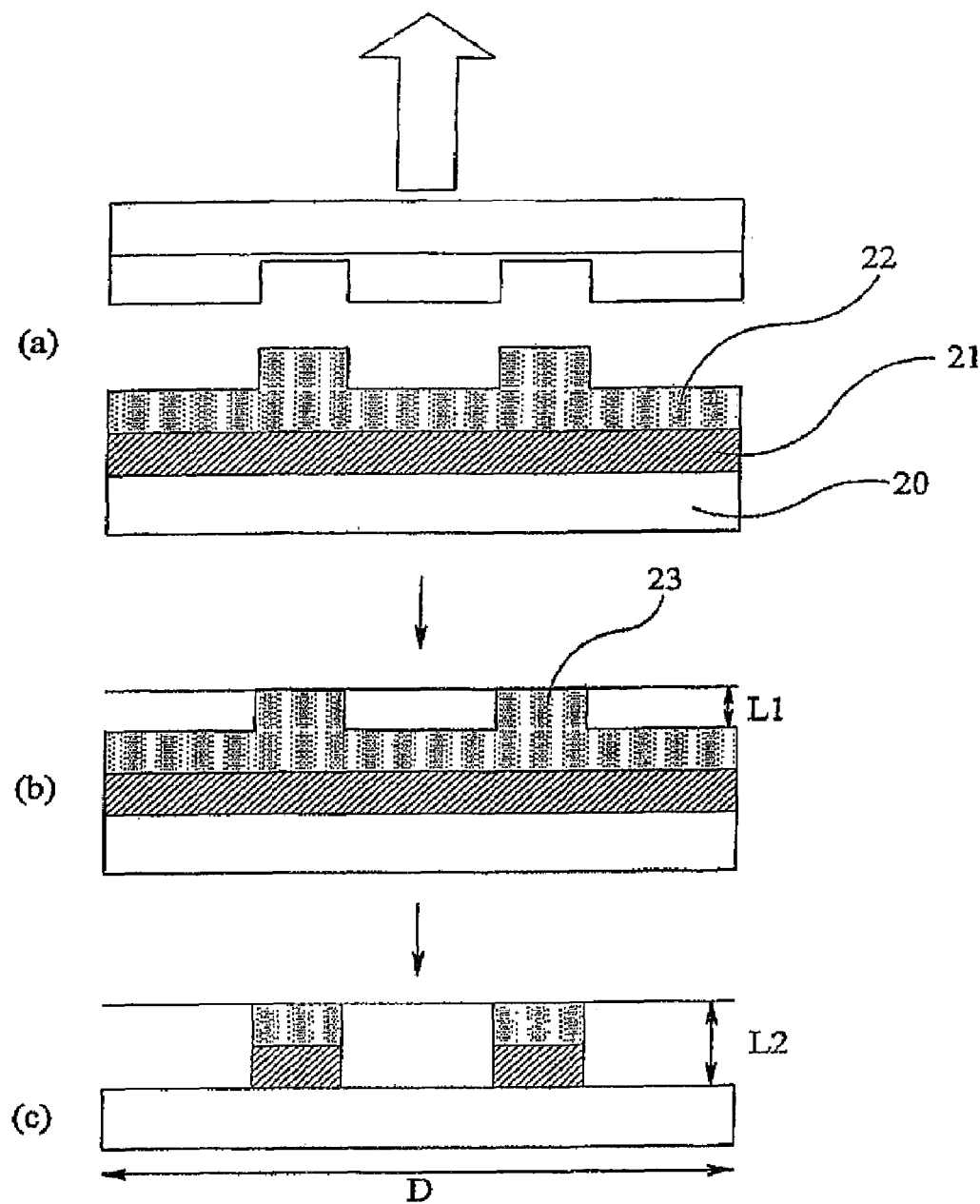
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used.

Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made herein to depositing UV curable liquids onto a substrate, the liquids could also be deposited on the template and in general the same techniques and considerations will apply.

Figure 3:
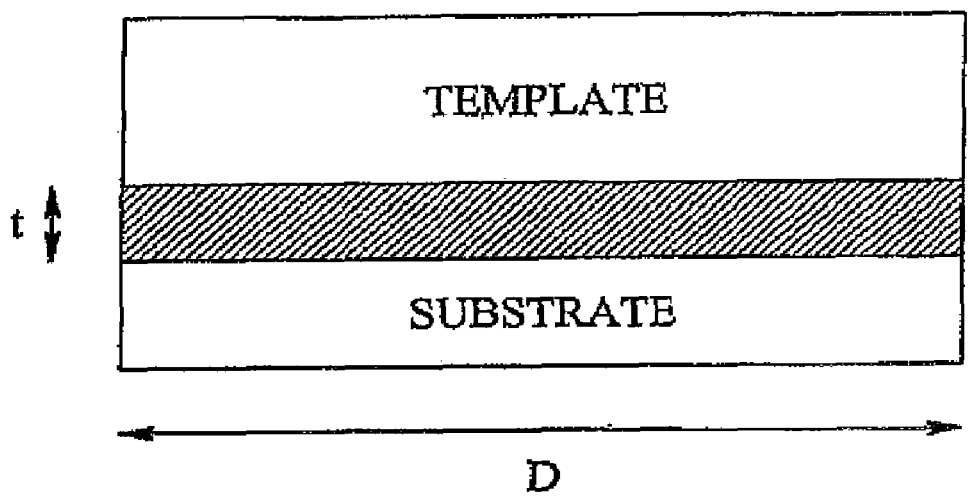
FIG. 3 schematically illustrates a template and a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or overlay accuracy is required. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non-linear response, etc. For example, the functional material may form a conductive layer, a semi-conductive layer, a dielectric layer or a layer having another desirable mechanical, electrical or optical property. Some organic substances may also be appropriate functional materials. Such applications may be within the scope of the invention.

Figure 4:
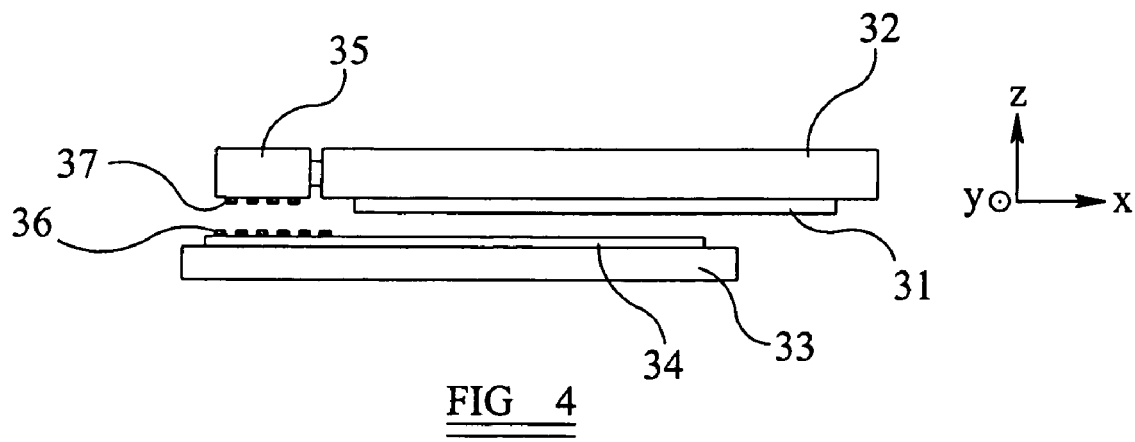
FIG. 4 schematically depicts an imprint lithography apparatus according to an embodiment of the invention.

FIG. 4 shows schematically an imprint lithography apparatus according to an embodiment, the apparatus comprising a template holder 32 configured to hold an imprint template 31 over a substrate table 33. A substrate 34 is held on the substrate table 33. An optical encoder 35 is attached to the template holder 32.

The substrate 34 is provided with an encoder scale 36 which comprises a diffraction grating. The diffraction grating is reflective. The optical encoder 35 is also provided with a diffraction grating 37. For ease of reference, the encoder scale 36 provided on the substrate 34 will hereafter be referred to as the substrate grating 36, and the diffraction grating 37 on the optical encoder 35 will be hereafter referred to as the detector grating 37.

Figure 4A:
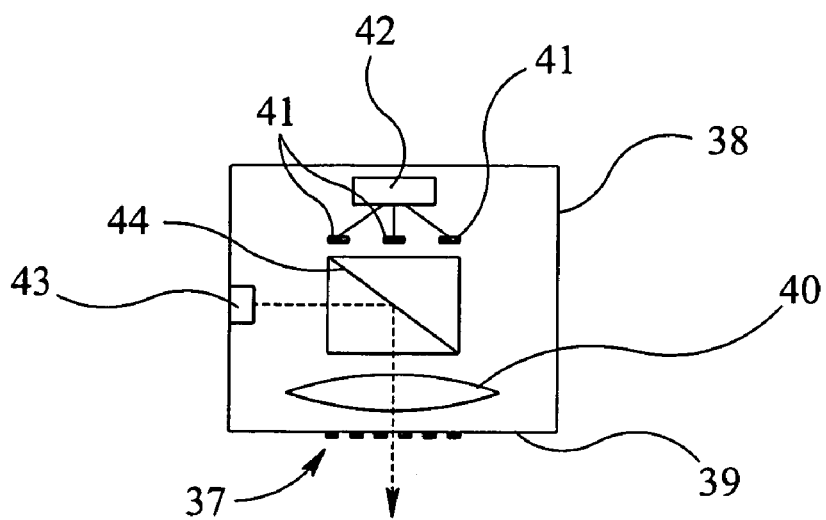
FIG. 4a schematically depicts the encoder of FIG. 4 in more detail.

FIG. 4a shows the optical encoder 35 in more detail. The optical encoder 35 comprises a box 38, a lowermost end of which is provided with a window 39 which is transmissive at a wavelength or wavelengths used for alignment. The detector grating 37 is provided as a transparent phase grating in the window 39. In an embodiment, the detector grating 37 may be an amplitude grating. A condenser lens 40 is located between the detector grating 37 and three photodiodes 41. The photodiodes 41 are connected to detector electronics 42.

A radiation source, having a radiation output, 43 is fixed to an inside wall of the box 38. Alternatively or additionally, radiation may be supplied to a radiation output 43 of the encoder 35 from a remote radiation source. A beam splitter 44 is located between the condenser lens 40 and the photodiodes 41, and is used to direct radiation from the radiation source 43 to the detector grating 37. The radiation source 43 is arranged to emit radiation at a wavelength suitable for lithographic alignment, and is for example a light emitting diode (LED) which emits radiation at a wavelength of 640 nanometers. The emitted radiation is shown schematically by a dotted line. It is not necessary that the radiation source emits visible light; for example a suitable infrared wavelength may be used. An advantage of providing illumination via the beam splitter 44 is that the zero-order of the detected diffraction pattern is eliminated, thereby making detection easier (there is no underlying background intensity).

In use, the substrate table 33 is scanned in the x-direction (standard Cartesian coordinates are marked onto FIG. 4), so that the substrate grating 36 passes underneath the detector grating 37. Radiation emitted from the radiation source 43 is diffracted on the substrate grating 36. The diffracted radiation is incident upon the detector grating 37. Because the substrate grating 36 and the detector grating 37 have slightly different grating periods, the effect of the detector grating 37 is to generate a Moiré pattern (also known as a beat pattern). A Moiré fringe fundamental period is $P=(p1*p2)/(p1-p2)$, where p1 is the period of the detector grating and p2 is the period of the substrate grating. The Moiré pattern is focused by the condenser lens 40 and is detected by the photodiodes 41.

The separation between the detector grating 37 and the substrate grating 36 is typically of the order of hundreds of nanometers. In an embodiment, there are no optical components located between the gratings 36, 37. This means that the detector grating 37 is in the proximity for radiation which has been diffracted by the substrate grating 36. This is why the combination of the detector grating 37 and the substrate grating 36 causes a Moiré pattern to occur.

The use of an optical encoder as described above is different from conventional alignment systems based upon diffraction grating alignment marks, as used in conventional optical lithography. In a conventional alignment system, a detector grating is located a substantial distance away from a substrate grating, and there are many optical components between them. The optical components form an image of the substrate grating which is projected onto the detector grating, and the overlap between the image of the substrate grating and the detector grating is used to obtain alignment information. No interference between the diffraction gratings takes place. In imprint lithography, it is possible to locate an optical encoder very close to a substrate, something typically impractical and inconvenient in conventional optical lithography apparatus. In addition, an optical encoder which uses a Moiré pattern can be used to align an imprint template with a substrate.

The photodiodes 41 are not imaging detectors, but instead are conventional photovoltaic cells, each producing a single output signal. The period of the beat pattern is known in advance, since the periods of the substrate grating 36 and the detector grating 37 are known. The separation between the photodiodes 41 is selected accordingly such that the Moiré pattern will be correctly detected during movement of the substrate table 33. In particular, the separation between the photodiodes 41 is selected so that aliasing of the detected signal substantially will not occur.

Based upon the detected Moiré signal, the relative positions of the substrate 34 and the optical encoder 35 are determined. Since the optical encoder 35 is fixed to the imprint template holder 32 on which the imprint template 31 is held, the relative positions of the substrate 34 and the imprint template 31 may be determined (i.e. the substrate 34 and the template 31 are aligned). This allows the imprint template 31 to be accurately aligned with patterns already present on the substrate 34, thereby allowing multiple layer structures to be fabricated.

As mentioned above, a typical separation between the detector grating 37 of the optical encoder 35 and the substrate 34 prior to imprint would be of the order of hundreds of nanometers. It could however be anywhere in the range of 50 nanometers to 10 microns. For a separation of, for example, 3 microns, a useful period for the substrate grating 36 would be 3.95 microns and a useful period for the detector grating 37 would be 3.60 microns. This would give a Moiré fringe period of 40 microns, which may be easily detected by the photodiodes 41. This will give an alignment accuracy of about 100 nm. Alignment accuracy may be determined as follows:

$$\text{Displacement} = (\text{Moiré shift}) * (p1)/(p1*p2/(p2-p1))$$

where p1 is the period of the detector grating and p2 is the period of the substrate grating, and 'displacement' is equivalent to alignment accuracy. The alignment accuracy can be seen to depend on how accurately the Moiré shift is measured (this is related to the number and position of the photodiodes), the magnification factor p1*p2/(p2−p1) (this comes from the difference between the periods of the detector grating and the substrate grating), and the period of the detector grating p1. The periods of the gratings, and the separation between the gratings may be selected as appropriate, depending upon the required alignment accuracy. Although the above example refers to gratings having periods of 3.95 microns and 3.60 microns, the gratings could have periods of, for example, between 50 nanometers and 10 microns.

The output signal provided by the detector electronics 42 of the optical encoder 35 is likely to comprise a sinusoidal signal, or something similar. An absolute reference is therefore used to determine the position of the substrate 34. The absolute reference may comprise a series of reference marks (not shown) located next to the substrate grating. One form of reference marks that could be used is a series of marks, each of which has a unique spacing relative to its immediate neighbors. An additional detector (not shown) may be used to detect the reference marks, for example by scanning over two or more reference marks and determining their separation.

The optical encoder may comprise a linear encoder, and the encoder scale may comprise, for example, a Vernier pattern or some other suitable linear pattern. It is also possible that the linear encoder and encoder scale be non-linear, although this may require the use of an appropriate non-linear position calculation. Although in the described embodiment, the substrate grating and the detector grating have different periods, they may in an alternative embodiment have the same period.

Optical encoders suitable for implementing an embodiment of the invention are available from Heidenhain Corporation of Schaumburg, Ill.

A separate prior measurement may be needed to determine the position of the imprint template 31 in relation to the template holder 32. This could, for example, be performed when the template 31 is first fixed to the template holder 32.

The described alignment measurement measures the relative locations of the substrate 34 and the imprint template 31 in the x-direction only. However, an equivalent measurement is usually also needed in the y-direction. In order to perform this measurement, the optical encoder 35 is provided with a detector grating (not shown) arranged in the y-direction and the substrate 34 is provided with a substrate grating (not shown) arranged in the y-direction. The measurement in the y-direction is performed in the same manner as the measurement in the x-direction. In an arrangement, the substrate grating and the detector grating extend in two dimensions, for example in a chess-board like structure, and may be used for measurements in the x and y directions. Use of these gratings can be extended to also determine rotations.

Although the substrate grating 36 shown in FIG. 4 is only marginally longer than the detector grating 37, the substrate grating 36 may in practice be considerably longer than this. For example, the substrate grating may extend across the entire substrate 34. A grid of substrate gratings may be provided, extending in the x and y directions. The grid may be conveniently located in scribe lanes, i.e. between target areas where dies (IC devices) are to be imprinted. The grid allows the location of the substrate, any rotation of the substrate, and any expansion or contraction of the substrate to be determined. In addition, the grid allows the location, rotation, expansion or contraction of individual target areas on the substrate to be determined.

In an arrangement, the substrate may be provided with a set of shorter substrate gratings. For example, four gratings may be provided at locations spread out across the substrate, thereby allowing the location of the substrate, any rotation of the substrate, and any expansion or contraction of the substrate to be determined. A larger number of substrate gratings may be used in order to increase the precision of the measurement of the substrate. For example, eight substrate gratings (not illustrated) may be provided at spaced apart locations on the substrate, and a subset of the eight substrate gratings may be used to measure the location of the substrate, the substrate gratings being selected on the basis of the perceived accuracy of their location (this is sometimes referred to as the n-of-m approach). In another arrangement, a substrate grating may be provided for each imprint location on the substrate, so that alignment to the substrate grating may be performed at each imprint location immediately before imprinting. In another arrangement, three substrate gratings may be provided for each imprint location on the substrate. This allows magnification errors or other errors that have occurred locally at that imprint location to be determined before imprinting.

In an embodiment, in addition to the detector grating, the optical encoder is provided with a further grating, the further grating having a longer period than the detector grating.

Although an embodiment has been described and illustrated with a substrate grating 36 (encoder scale) on a substrate 34, the encoder scale may, in an embodiment, comprise a grating (not illustrated) provided on the substrate table 33. A suitable grating may be provided along one side of the substrate table in the x-direction and along a different side of the substrate table in the y-direction.

Although an embodiment has been described and illustrated with the optical encoder 35 located adjacent to the template holder 32, the optical encoder may be provided in other positions. For example, in an embodiment (not illustrated), an optical encoder without a detector grating may be located above the imprint template 31, with a detector grating 37 being provided as part of the imprint template 31 itself (a suitable opening or window being provided in the template holder 32). This has an advantage that an alignment measurement is a direct measurement of the location of the substrate relative to the imprint template.

Figure 6:
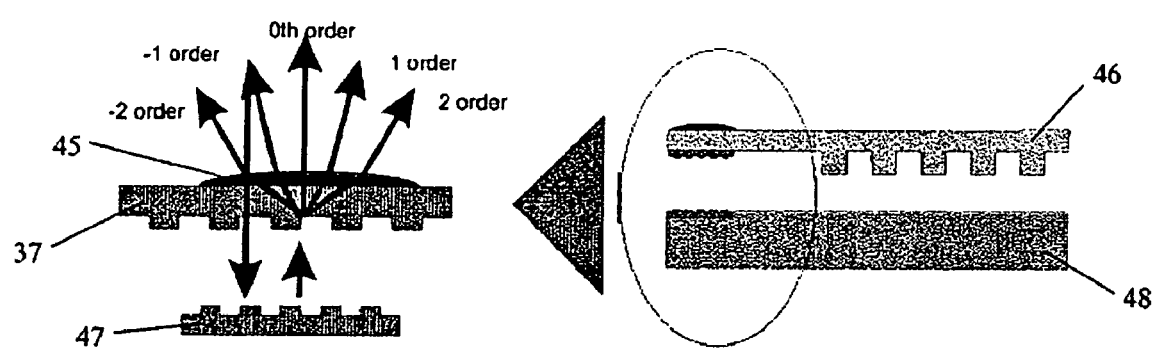
FIG. 6 schematically depicts a modified part of the apparatus shown in FIG. 4.

A lens or other optical component may be provided with the detector grating 37 of the optical encoder 35. For example, referring to FIG. 6, a lens 45 may be located over a detector grating 37 provided on an imprint template 46. The lens 45 couples diffraction orders to a detector (not shown), the diffraction orders being generated by a combination of the detector grating 37 and a substrate grating 47 provided on a substrate 48. The effect of the lens 45 is to couple more diffraction orders to the detector than would otherwise be the case. In this way, the lens 45 increases the resolution with which alignment can be detected. This is illustrated schematically in FIG. 6 by showing how the first and second diffraction orders pass through the lens 45. If the lens 45 were not present then the second diffraction order might not be coupled to the detector, but might instead undergo total internal reflection at the upper surface of the imprint template 46 and thereby be directed away from the detector.

Other optical components may be provided with the detector grating 37. For example, an additional diffraction grating (not shown) may be provided in place of the lens 45 shown in FIG. 6. The additional diffraction grating may be arranged to selectively couple particular diffraction orders to the detector. For example, the additional diffraction grating may be arranged to couple $3^{rd}$ and $5^{th}$ order diffraction orders to the detector, and couple other diffraction orders away from the detector. This may be done for example if it has been found that the $3^{rd}$ and $5^{th}$ order diffraction orders provide the most accurate alignment.

The detector grating 37 may be provided with a prism (not shown) instead of the diffraction grating. Alternatively, ridges of the diffraction grating may be given an angled profile, such that the diffraction grating incorporates prism-like properties.

Although the embodiment of the invention has been described in terms of encoders, it will be appreciated that alignment may be achieved using a substrate diffraction grating which does not include encoded positional information (i.e. using a conventional alignment diffraction grating). This may be referred to as proximity alignment. Where proximity alignment is used, alignment may be achieved by using a detector of the type described in relation to FIG. 4. The arrangement shown in FIG. 6, wherein a lens 45 (or other optical component) is provided with the detector grating 37 may be used for such alignment.

The optical encoder 35 may be used in combination with a second different type of alignment sensor. For example, an alignment sensor which uses capacitance measurement to determine alignment may be used to obtain a coarse alignment measurement, with the optical encoder shown in FIG. 4 providing a fine alignment measurement. A suitable capacitive alignment detector is shown schematically in FIG. 5.

Figure 5:
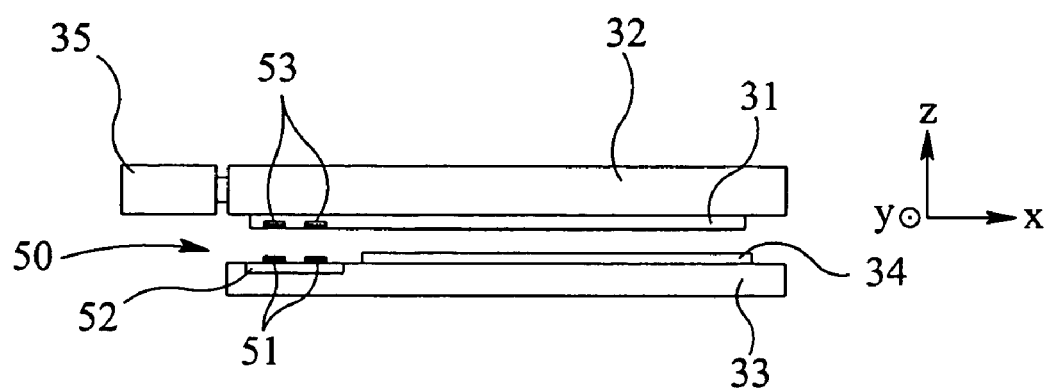
FIG. 5 schematically depicts an imprint lithography apparatus according to an another embodiment of the invention.

Referring to FIG. 5, a substrate table 33 holds a substrate 34 and is provided with an alignment sensor 50 comprising capacitive sensors 51 connected to detection electronics 52. An imprint template 31, held by template holder 32, is provided with capacitor plates 53. The capacitive sensors 51 are provided with an electrical charge, and the substrate table 33 is then scanned underneath the template 31. As a result of this scanning motion, the capacitive sensors 51 provide output signals which peak when the capacitor plates 53 are located directly over the capacitive sensors 51. This measurement provides a coarse alignment of the substrate table 33 and the imprint template 31. Following the coarse alignment, the alignment sensor 35 may be used to precisely measure the relative position of the template holder 32 with respect to the substrate 34. The coarse alignment may be repeated in the y-direction using additional capacitive sensors (not shown).

The capacitor plates may be provided in the template holder 32, instead of, or in addition to, being provided in the template 31.

Although the optical encoder 35 is described as using photodiodes 41, it will be appreciated that other suitable detectors may be used. For example, the photodiodes 41 may be replaced by one or more imaging detectors (e.g. charge coupled device array(s)).

While specific examples of the invention have been described above, it will be appreciated that the invention may be practiced otherwise than as described. The description is not intended to limit the invention.

The invention claimed is:

1. An imprint lithography apparatus comprising a template holder configured to hold an imprint template, a substrate table, and an optical encoder, the optical encoder having a radiation output, a first diffraction grating, and a detector, the radiation output arranged to illuminate a second diffraction grating and the detector positioned to detect radiation diffracted by the first and second diffraction gratings to provide an alignment signal.

2. The apparatus according to claim 1, wherein the second diffraction grating is located on the substrate table.

3. The apparatus according to claim 1, wherein the first diffraction grating is provided on the imprint template.

4. The apparatus according to claim 1, wherein the first diffraction grating is a transmissive phase grating.

5. The apparatus according to claim 1, wherein the first diffraction grating is an amplitude grating.

6. The apparatus according to claim 1, wherein the radiation output is configured such that radiation emitted from the radiation output passes through the first diffraction grating before passing to the second diffraction grating.

7. The apparatus according to claim 1, wherein the detector comprises a plurality of spaced apart photodiodes.

8. The apparatus according to claim 1, wherein the period of the second diffraction grating is between 50 nanometers and 10 microns.

9. The apparatus according to claim 1, wherein the period of the first diffraction grating is between 50 nanometers and 10 microns.

10. The apparatus according to claim 1, wherein the second diffraction grating and the first diffraction grating are spaced apart by between 50 nanometers and 10 microns.

11. The apparatus according to claim 1, wherein in addition to the first diffraction grating, the optical encoder is provided with a further diffraction grating, the further diffraction grating having a longer period than the first diffraction grating.

12. The apparatus according to claim 1, wherein the first diffraction grating extends in a predetermined direction, and the second diffraction grating extends in the same direction.

13. The apparatus according to claim 1, wherein the first diffraction grating and the second diffraction grating both extend in two directions.

14. The apparatus according to claim 1, wherein the detected radiation comprises a Moiré pattern.

15. The apparatus according to claim 1, wherein an optical component is provided with the first diffraction grating.

16. The apparatus according to claim 15, wherein the optical component is a lens, a diffraction grating or a prism.

* * * * *